(12) United States Patent
Ishikura

(10) Patent No.: US 6,497,917 B2
(45) Date of Patent: Dec. 24, 2002

(54) ULTRAFINE PARTICLE FILM FORMING METHOD

(75) Inventor: Junri Ishikura, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/935,841

(22) Filed: Aug. 24, 2001

(65) Prior Publication Data

US 2002/0045005 A1 Apr. 18, 2002

(30) Foreign Application Priority Data

Aug. 25, 2000 (JP) ........................... 2000-255869

(51) Int. Cl.[7] .................... B05D 1/12; C23C 30/00
(52) U.S. Cl. .................... 427/9; 427/190; 427/191; 427/250
(58) Field of Search .................... 427/8, 9, 248.1, 427/250, 251, 255.5, 580, 189, 191, 424

(56) References Cited

U.S. PATENT DOCUMENTS 5,621,751 A * 4/1997 Williamson et al. ........ 373/104
6,060,109 A * 5/2000 Tanaka et al. .............. 427/250

* cited by examiner

Primary Examiner—Timothy Meeks
Assistant Examiner—William Phillip Fletcher, III
(74) Attorney, Agent, or Firm—Fitzpatrick, Cella, Harper & Scinto

(57) ABSTRACT

To provide a film forming method, a film forming apparatus and a manufacturing method of ultrafine particle films, implementing an efficient and proper film thickness control. The manufacturing method of ultrafine particle films includes the steps of: guiding metal ultrafine particles generated in an ultrafine particle generation chamber together with a carrier gas through a conveying pipe to the film forming chamber; and forming a film on a substrate installed over a stage in the film forming chamber through a nozzle, and the evaporated amount of said evaporation material or the thickness of a formed film is controlled by using either the intensity of the emission spectrum intrinsic to an evaporation material or that of the emission spectrum intrinsic to the carrier gas, or else by using both of these.

4 Claims, 2 Drawing Sheets

ULTRAFINE PARTICLE FILM FORMING METHOD

BACKGROUND OF THE INVENTION

1. Field of the Invention

The present invention relates especially to a method and apparatus for forming a film by using gas deposition process.

2. Related Background Art

Here, first, the gas deposition process will be described in brief. FIG. 3 shows an outline configuration of a film forming apparatus using the gas deposition process. In FIG. 3, this gas deposition process employs an apparatus comprising an ultrafine particle (grain) producing chamber 1, a film forming chamber 2, a conveying pipe 3 or the like. With the ultrafine particle producing chamber 1, a material 8 is heated by using an arc (arc electrode 5), resistor heating, high frequency wave induction heating, laser radiation or the like in the atmosphere of an inert gas.

And, metal ultrafine particles produced by melting, evaporation (gasification) and collision with the inert gas are guided through the conveying pipe (conveying system) 3 to the film forming chamber 2 by means of the pressure difference between the ultrafine particle producing chamber 1 and the film forming chamber 2. And, by high-speed jet from a nozzle 4 connected to the end of the conveying pipe 3, a pattern is depicted directly on a substrate 10 over a stage 9. Incidentally, in FIG. 3, Reference Numerals 6 and 7 denote a pump and a helium gas, respectively.

This type of dry film forming process is known in Japanese Patent No. 2524622, 1595398, 2632409 or 2596434.

Besides, ultrafine particles (grains) are defined to be particulate invisible to an optical microscope, i.e. grains of 1 $\mu$m grain size or smaller (Vacuum Handbook, p.289 (Nippon Shinku, Ltd.)). In such a gas deposition process, a film thickness control method is generally to stabilize the material evaporated amount, i.e. ultrafine particle (grain) produced amount and to regulate the travelling speed of the stage holding a substrate. To keep this material evaporated (produced) amount constant, the high-frequency wave induction heating process generally monitors the crucible temperature from the window of the ultrafine particle producing chamber by using a pyrometer or the like and control the electric source power so as to always keep it constant.

Especially in case of heating a material by the arc heating, however, monitoring the temperature of a material by using a pyrometer or the like is extremely sensitive to the place of the material and convection occurs in the melting portion. Under such circumstances, it is extremely difficult to control the arcing power.

Besides, for the arc heating, a constant evaporated amount is theoretically obtained if the value of current, the value of voltage or a material-arc electrode distance can be kept constant. Actually, however, it is substantially impossible to keep these constant continuously because an electrodes tip is deformed on account of melting or the like of an arc electrode. In this point of view, especially as shown in Japanese Patent Application Laid-Open No. 12-17427, it is intended to keep the arc voltage constant and to stably form ultrafine particles. In the case of arc discharge, however, the gap between the electrode and the material widens with the lapse of time on account of melting of an arc electrode and the voltage does not fail to rise as mentioned above.

Such being the case, even if an attempt is made to contract this widened gap and to keep the voltage constant, the initial gap and voltage are not recovered because the electrode surface is deformed rounder. If the gap is forcibly contracted to recover the initial voltage, both of them come into contact with each other and the discharge never fails to end. Besides, if a current is raised so as to keep the voltage constant, the evaporated amount never fails to increase than initial. In such a manner, it is difficult with the arc heating to keep the evaporated amount constant or to control the one.

SUMMARY OF THE INVENTION

It is an object of the present invention to provide a film forming method, a film forming apparatus and a manufacturing method of ultrafine particle films as implementing an effective and proper film thickness control.

The present invention relates to a manufacturing method of ultrafine particle films using the gas deposition process including: guiding metal ultrafine particles produced in an ultrafine particle producing chamber together with a carrier gas through a conveying pipe to the film forming chamber; and forming a film on a substrate installed over a stage in the film forming chamber through a nozzle; characterized by using either the intensity of the emission spectrum intrinsic to an evaporation material or that of the emission spectrum intrinsic to the carrier gas or else by using both of these to control the evaporated amount of the above evaporation material and the thickness of a formed film.

Besides, the present invention relates to a film forming method including the steps of: evaporating a source material; bringing a gas different from the above source material into contact with the above evaporated source material to granulate the above evaporated source material; and conveying the grains together with the above gas and colliding them onto a substrate to form a film on the substrate, characterized by controlling the evaporated amount of the above evaporation material and the thickness of a film formed on the above substrate on the basis of the emission spectrum intensity intrinsic to an evaporation material produced in gasifying the above source gas and/or and the one intrinsic to the above carrier gas.

Besides, the present invention relates to a film forming apparatus including: means for gasifying a source material; means for ejecting a gas different from the above source material so as to coming into contact with the above evaporated source material to granulate the above evaporated source material; means for conveying the grains together with the above gas to collide them onto a substrate; and means for controlling the position of the above substrate, characterized by the provision of spectrum detection means for detecting the emission spectra of the above gasified source material and condition control means for controlling the conditions for gasifying the above source material to form the above grains on the basis of the detected value of the above spectrum detection means.

DETAILED DESCRIPTION OF THE PREFERRED EMBODIMENTS

Figure 1:
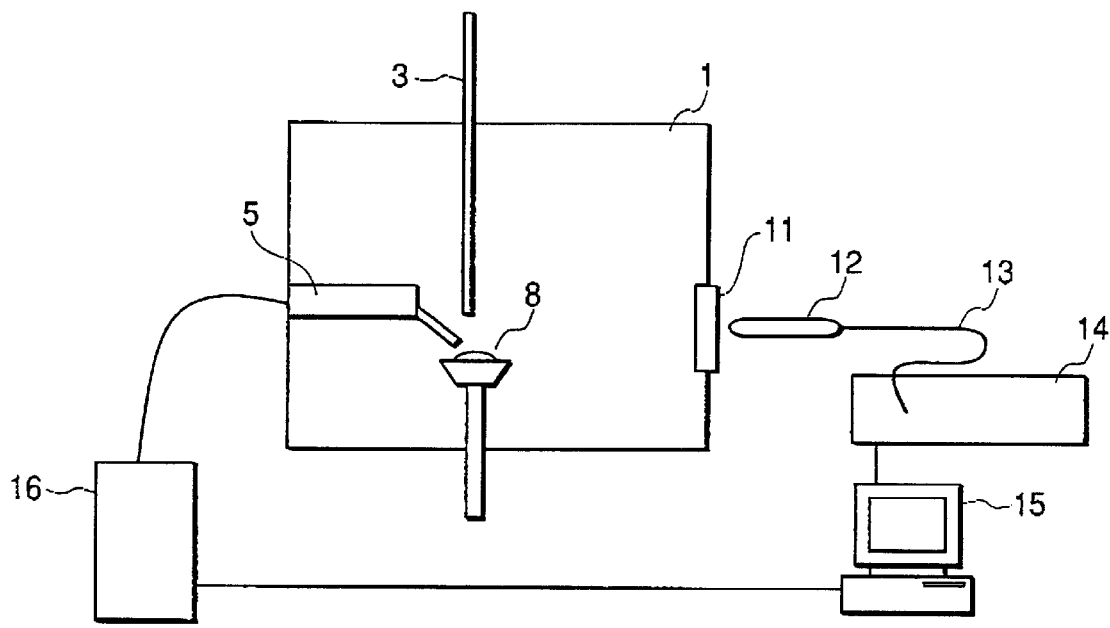
FIG. 1 is a schematic illustration of an ultrafine particle producing chamber for applying a signal of an instantaneous multi-spectrometer to a DC arc electric source under close control according to an embodiment of the present invention.

Hereinafter, the present invention will be described in details.

A manufacturing method of ultrafine particle films according to the present invention is a manufacturing method including: guiding metal ultrafine particles produced in an ultrafine particle producing chamber together with a carrier gas through a conveying pipe to the film forming chamber; and forming a film on a substrate installed over a stage in the film forming chamber through a nozzle, characterized by using either the emission spectrum intensity intrinsic to an evaporation material or the one intrinsic to the carrier gas or else by using both of these to control the evaporated amount of the above evaporation material and the thickness of a formed film.

Besides, the film forming method of an ultrafine particle film according to the present invention is characterized by controlling either the gap between the evaporation material and an electrode or the value of current or else by controlling both of these so that the emission spectrum intensity intrinsic to the above evaporation material remains constant during the film forming.

Besides, the film forming method of an ultrafine particle film according to the present invention is characterized by melting the above evaporation material by arc heating to manufacture an ultrafine particle film.

Besides, the film forming method according to the present invention is a film forming method including the steps of: evaporating a source material; bringing a gas different from the above source material into contact with the above evaporated source material to granulate the above evaporated source material; and conveying the grains together with the above gas and colliding them onto a substrate to form a film on the substrate, characterized by controlling the gasified amount of the above evaporation material or the thickness of a film formed on the above substrate on the basis of the emission spectrum intensity intrinsic to an evaporation material produced in gasifying the above source gas and/or and the one intrinsic to the above carrier gas.

Besides, the film forming apparatus according to the present invention is a film forming apparatus including: means for gasifying a source material; means for ejecting a gas different from the above source material so as to coming into contact with the above evaporated source material to granulate the above evaporated source material; means for conveying the grains together with the above gas to collide them onto a substrate; and means for controlling the position of the above substrate, characterized by the provision of spectrum detection means for detecting the emission spectra of the above gasified source material and condition control means for controlling the conditions for gasifying the above source material to form the above grains on the basis of the detected value of the above spectrum detection means.

According to the present invention, the evaporated amount of an aimed material or the thickness of a formed film is controlled by using the emission spectrum intensity intrinsic to an evaporation material during the arc heating or a combination of the emission spectrum intensity intrinsic to an evaporation material and the one intrinsic to a carrier gas.

Besides, by regulating either the gap between the material-arc electrode distance or the value of current or else by regulating both of these so that the emission spectrum intensity intrinsic to the material kept in view, a stable evaporation/film formation become possible.

Besides, by regulating a relative value of emission intensity, the film thickness can be adjusted while the substrate travelling speed kept constant.

EXAMPLES OF THE INVENTION

Referring to the drawings, the preferable practical embodiments of a film forming method, a film forming apparatus and a manufacturing method of ultrafine particle film according to the present invention will be described below.

Figure 3:
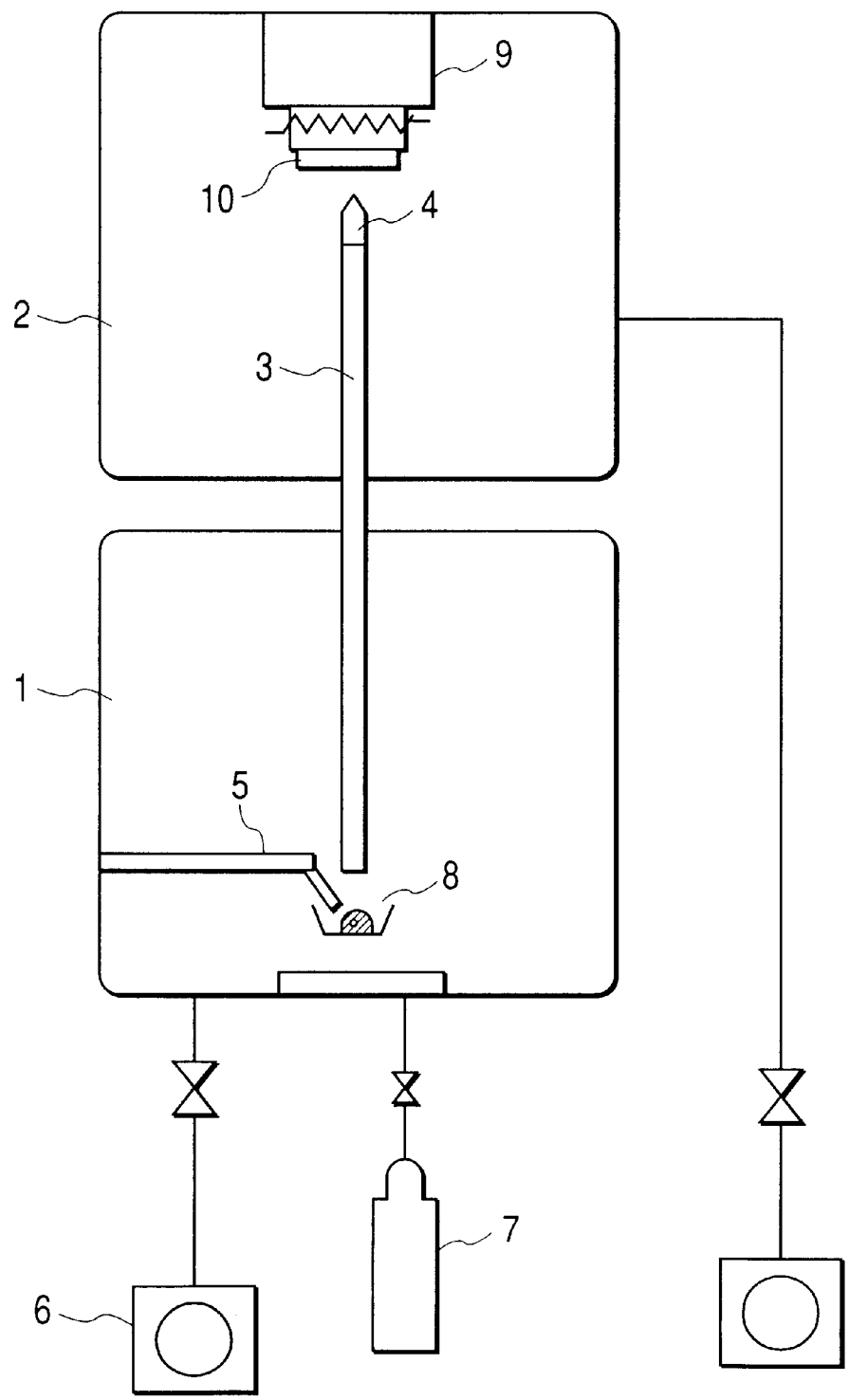
FIG. 3 is a schematic illustration of a film forming apparatus using a gas deposition process.

At the side of a viewing port 11 comprising a quartz window in the ultrafine particle (grain) producing chamber 1 of a gas deposition device, as shown in FIG. 1, there is installed a quartz-made fiber 12 for capturing arc rays generated in the chamber 1 by means of a spectrometer 14 (in this example, an "instantaneous multi-spectrometer" (available from Ohtsuka Denshi, Ltd.) was employed). Incidentally, the film forming chamber employed in the present invention is omitted in illustration because of being similar to that shown in FIG. 3.

By using silver Ag as an evaporation material (grain source material) 8, helium He as a carrier gas and tungsten W as an arc electrode 5, arc discharge is generated.

Besides, other conditions will be shown below:

Ultrafine particle producing chamber pressure: 500 Torr;

Film forming chamber pressure: 1 Torr;

Initial arc power: 100 A and 15 V;

Arc power till the completion of discharge: 100 to 120 A and 15 to 17 V;

Multi-spectrometer Conditions

Sampling time: 10 msec;

Accum. time: 10 times;

Ag spectrum monitor wavelength: 546.5 nm;

Maintained emission spectrum intensity: 0.3;

Used nozzle discharge port caliber: φ1 mm; and

Used substrate: glass.

Under these film forming conditions, Ag (source material) was evaporated to form ultrafine particles (grains) of Ag. And, they are carried together with He gas to form (depict) a 500 mm long line on a glass substrate placed over a stage.

In the evaporation by this arc heating of Ag, a signal of the spectrometer 14 was taken into a personal computer 15 so as to always keep the Ag emission spectrum at a wavelength of 546.5 nm at an intensity of 0.3 and thereby control the value of current in the DC arc source 16.

Incidentally, among the above film forming conditions, the value of voltage has a width because an electrode and/or a material is melted during the discharge, the gap between them increases and the voltage gradually increases and because elevating the value of current for the maintenance of the emission intensity necessarily results in a fall of voltage.

To estimate the stability and uniformity of the film thickness after the depiction of a line, the film thickness of the line depicted on a substrate travelling at a fixed speed was measured by means of a contact type film thickness meter. The result is shown in Table 1. This Table 1 shows a time change in film thickness under application of control over the value of current so that the intensity of the Ag emission wavelength remains constant.

TABLE 1

| Position (mm) | 0 | 50 | 100 | 150 | 200 | 250 | 300 | 350 | 400 | 450 | 500 |
|---|---|---|---|---|---|---|---|---|---|---|---|
| Film Thickness ($\mu$m) | 20 | 23 | 21 | 20 | 24 | 22 | 21 | 22 | 20 | 20 | 21 |

By keeping the emission spectrum intensity intrinsic to an evaporation material constant, as mentioned above, a uniform film on the order of ±10% in film thickness could be formed.

First Comparative Example

Under the same conditions as with the above example, film formation was carried out without application of control over the electric source based on the emission intensity. The discharge initiation voltage and current are identical to those of the above embodiment. After the initiation of discharge, an electrode and/or a material was gradually melted and the gap between both of them increased. And, the voltage gradually increases and reached 21 V directly before the completion of discharge. The value of current is 100 A and fixed. The thickness of a film formed in First Comparative Example was measured as with the above example and the result is shown in Table 2. Table 2 shows a time change in film thickness without application of control based on the emission intensity.

TABLE 2

| Position (mm) | 0 | 50 | 100 | 150 | 200 | 250 | 300 | 350 | 400 | 450 | 500 |
|---|---|---|---|---|---|---|---|---|---|---|---|
| Film Thickness ($\mu$m) | 25 | 10 | 5 | 5 | 3 | 3 | 2 | 2 | 0.2 | 0.2 | 0.1 |

In the film forming without keeping the emission intensity constant, as understood from Table 2, the film thickness cannot be kept constant even if the value of current is kept constant.

Next, Second Example will be described.

In this example, film forming was carried out by using Ag as an evaporation material and He as a carrier gas at an apparatus similar to that of First Example.

Though dependent on the value of current, the emission intensity at 587.6 nm intrinsic to He becomes as small as negligible as compared with the Ag emission spectra at voltages on the order of 15 to 17 V. Above this order, however, the emission intensity increases with increasing value of voltage. This can be thought to be because the energy invested into the arc heating is used for the excitation of He and the material is not efficiently heated. Thus, the peak intrinsic to He was monitored and a relation between the evaporated amount and the emission intensity of Ag was confirmed within a voltage rage in which no He peak appears.

The chamber pressure conditions during the film forming and the measuring conditions of a spectrometer are the same as with First Example. The monitor wavelength is equal to the addition of the He emission wavelength, 587.6 nm to of the Ag emission, 546.5 nm. For estimates of the film thickness, as with First Example, deposited lines were depicted on a glass substrate over the substrate respectively by changing the conditions and thereafter the film thickness was estimated. The travelling speed of the stage is similar to that of First Example. The voltage was controlled by changing the gap between the material and the electrode.

In Table 3, the forming conditions and the results of film thickness estimates are shown. Incidentally, estimates were made by fixing the value of current to 100 A. Table 3 shows a relation between the emission intensities of He and Ag and the film thickness of an Ag film at a current of 100 A.

TABLE 3

| Voltage (V) | 12 | 13 | 14 | 15 | 16 | 17 | 18 | 19 | 20 |
|---|---|---|---|---|---|---|---|---|---|
| Film Thickness ($\mu$m) | 9 | 11 | 13 | 15 | 17 | 19 | 17 | 11 | 2 |
| He Intensity | 0 | 0 | 0 | 0 | 0 | 0 | 0.05 | 0.2 | 0.4 |

TABLE 3-continued

| Voltage (V) | 12 | 13 | 14 | 15 | 16 | 17 | 18 | 19 | 20 |
|---|---|---|---|---|---|---|---|---|---|
| Ag Intensity | 0.08 | 0.12 | 0.18 | 0.22 | 0.26 | 0.3 | 0.3 | 0.1 | 0.05 |

In Table 4, the forming conditions and the results of film thickness estimates are shown. Incidentally, estimates were made by fixing the value of current to 60 A. Table 4 shows a relation between the emission intensities of He and Ag and the film thickness of an Ag film at a current of 60 A.

TABLE 4

| Voltage (V) | 12 | 13 | 14 | 15 | 16 | 17 | 18 | 19 | 20 |
|---|---|---|---|---|---|---|---|---|---|
| Film Thickness ($\mu$m) | 3 | 4 | 5 | 6 | 7 | 7 | 0.1 | 0 | 0 |
| He Intensity | 0 | 0 | 0 | 0 | 0 | 0.02 | 0.05 | 0.15 | 0.22 |
| Ag Intensity | 0.06 | 0.07 | 0.08 | 0.09 | 0.10 | 0.09 | 0.05 | 0.01 | 0.01 |

In the range where the He emission intensity peak monitored is negligible as compared with the peak of the material emission wavelength, as understood from these results, control of the emission spectrum intensity of the material enables the film thickness to be controlled.

Next, Third Example will be described.

Figure 2:
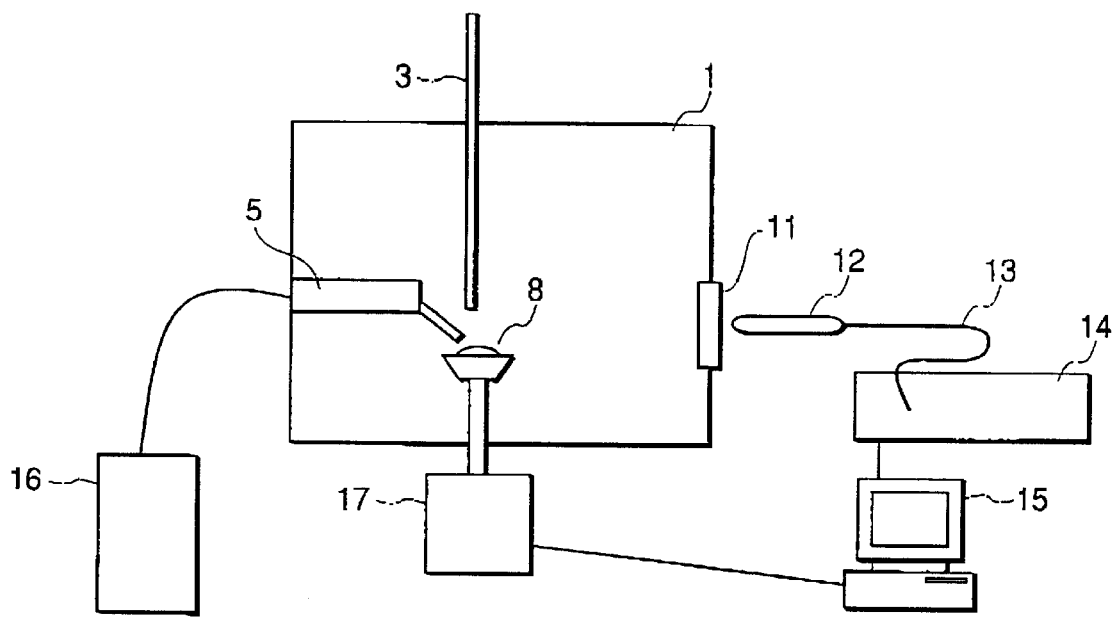
FIG. 2 is a schematic illustration of an ultrafine particle producing chamber for applying a signal of an instantaneous multi-spectrometer to a mechanism for lifting and falling hearse (crucible) under close control according to an embodiment of the present invention.

In this example, the control of film thickness was carried out by fixing the value of current and under application of closed control over the electrode-material distance so that the emission spectrum intensity remains constant (FIG. 2). The regulation of the electrode-material distance may be performed either the travelling of an electrode or that of a material, but it is performed by lifting and falling a hearse (crucible) with a material put therein in this embodiment.

A mechanism may be used for lifting and falling, i.e., sliding upwardly and downwardly the hearse so that an instantaneous spectrum of the multi spectrometer is made constant, thereby adjusting a distance from on a tip of the electrode to the material. Such adjusting the distance would adjust an arc voltage.

The evaporation material is Ag, the carrier gas is He and the respective monitor wavelengths are 546.5 nm and 587.6 nm. The other conditions are the same as with First and Second Examples.

Based on the results of Second Example, the present inventors carried out the film formation for Ag emission intensities varying from 0.05 to 0.5 by fixing the value of current to 100 A and in the range of negligibly small He emission intensities as compared with that of Ag. As with Second Example, Estimates of the thickness of formed films were made while a substrate was moved at a constant speed under respective conditions.

The estimated results in Third Examples are shown in Table 5. Table 5 indicates a relation between emission intensities and film thickness under application of control based on emission intensity over a hearse lift mechanism.

TABLE 5

| Ag Intensity | 0.05 | 0.1 | 0.2 | 0.3 | 0.4 | 0.5 |
|---|---|---|---|---|---|---|
| He Intensity | 0 | 0 | 0 | 0 | 0 | 0 |
| Film Thickness ($\mu$m) | 5 | 10 | 15 | 20 | 26 | 30 |

Like these, in the range of fully negligibly small He emission intensities as compared with that of Ag, evaporation under application of closed control over current and/or the material-arc distance so that the emission spectrum intensity remains constant has enabled the film thickness to be controlled to any extent.

According to the present invention, as described above, use of the emission spectrum intensity intrinsic to an evaporation material during the arc heating or use of a combination of the emission spectrum intensity intrinsic to an evaporation material and the one intrinsic to a carrier gas enables the evaporated amount of an aimed material, or the thickness of a formed film. Besides, by using the emission intensity to apply control over the current or the material-arc distance, it has been made possible to more easily control the film thickness to any extent.

What is claimed is:

1. A manufacturing method of ultrafine particle films, comprising the steps of:

guiding metal ultrafine particles, generated in an ultrafine particle generation chamber from an evaporation material, together with a carrier gas through a conveying pipe to a film forming chamber; and forming a film on a substrate installed over a stage in the film forming chamber through a nozzle, wherein said step of forming the film includes controlling the thickness of a formed film by monitoring both an intensity of an emission spectrum intrinsic to the evaporation material and an emission spectrum intrinsic to the carrier gas.

2. The manufacturing method of ultrafine particle films as set forth in claim 1, wherein said controlling thickness of the formed film includes contolling either the gap between the evaporation material and an electrode or a current value or both of these, so that the emission spectral intensity intrinsic to said evaporation material remains constant during the film forming.

3. The manufacturing method of ultrafine particle films as set forth in claim 1 or 2, wherein said evaporation material is melted by arc heating to manufacture an ultrafine particle film.

4. The manufacturing method of ultrafine particle films as set forth in claim 1 or 2, wherein said controlling the thickness of the formed film is conducted so as to maintain the intensity of the emission spectrum intrinsic to the carrier gas smaller than the intensity of the emission spectrum intrinsic to the evaporation material.

* * * * *